United States Patent
Chang et al.

(10) Patent No.: US 8,982,127 B2
(45) Date of Patent: Mar. 17, 2015

(54) COMPUTING DEVICE AND METHOD FOR ESTABLISHING THREE DIMENSIONAL COORDINATE SYSTEM USING GRAPHICS

(75) Inventors: Chih-Kuang Chang, New Taipei (TW); Xin-Yuan Wu, Shenzhen (CN); Wei Wang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 200 days.

(21) Appl. No.: 13/598,786

(22) Filed: Aug. 30, 2012

(65) Prior Publication Data

US 2013/0162642 A1 Jun. 27, 2013

(30) Foreign Application Priority Data

Dec. 23, 2011 (CN) .......................... 2011 1 0437301

(51) Int. Cl.
*G06T 15/10* (2011.01)
(52) U.S. Cl.
CPC .................... *G06T 15/10* (2013.01)
USPC ......................................... 345/427

(58) Field of Classification Search
None
See application file for complete search history.

(56) References Cited

U.S. PATENT DOCUMENTS

| 5,237,647 A * | 8/1993 | Roberts et al. ................. 345/419 |
| 2007/0233298 A1 * | 10/2007 | Heide et al. ...................... 700/98 |
| 2008/0012851 A1 * | 1/2008 | Bae et al. ........................ 345/419 |
| 2008/0024491 A1 * | 1/2008 | Sathe et al. .................... 345/421 |
| 2008/0238916 A1 * | 10/2008 | Ghosh et al. ................... 345/419 |

* cited by examiner

*Primary Examiner* — Daniel Hajnik
(74) *Attorney, Agent, or Firm* — Novak Druce Connolly Bove + Quigg LLP

(57) ABSTRACT

In a method for establishing a three-dimensional coordinate system, the method establishes an original coordinate system in a design drawing of a product, and draws a hollow cube. Faces of the hollow cube are marked with different directions. Using the hollow cube, the method calculates a first matrix for correcting the original coordinate system according to a selected plane from the design drawing. The method also calculates a second matrix for correcting the original coordinate system according to a selected line, and calculates a third matrix for correcting the original coordinate system according to a selected point or a center of a selected circle. By multiplying the three matrixes, a new matrix is generated to establish a new coordinate system, which is displayed on a display screen.

16 Claims, 5 Drawing Sheets

COMPUTING DEVICE AND METHOD FOR ESTABLISHING THREE DIMENSIONAL COORDINATE SYSTEM USING GRAPHICS

BACKGROUND

1. Technical Field

Embodiments of the present disclosure generally relate to measurement management, and more particularly to a computing device and a method for establishing a three dimensional coordinate system using graphics.

2. Description of Related Art

Image measurement machines (IMMs) are used in industry to measure manufactured parts. Before measuring a small part of a product, an appropriate coordinate system must be established. In related art, the appropriate coordinate system is established by inputting values and parameters into a software program. In this method, an operator needs spatial concepts and a mathematical foundation, and no simulation process is carried out before the coordinate system is established. Establishing the coordinate system is a complicated series of steps. Therefore, an improved system and method addressing the aforementioned issues are desired.

DETAILED DESCRIPTION

In general, the term "module," as used herein, refers to logic embodied in hardware or firmware, or to a collection of software instructions, written in a programming language, such as, for example, Java, C, or assembly. One or more software instructions in the modules may be embedded in firmware, such as in an erasable-programmable read-only memory (EPROM). It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable medium or computer storage device.

Figure 1:
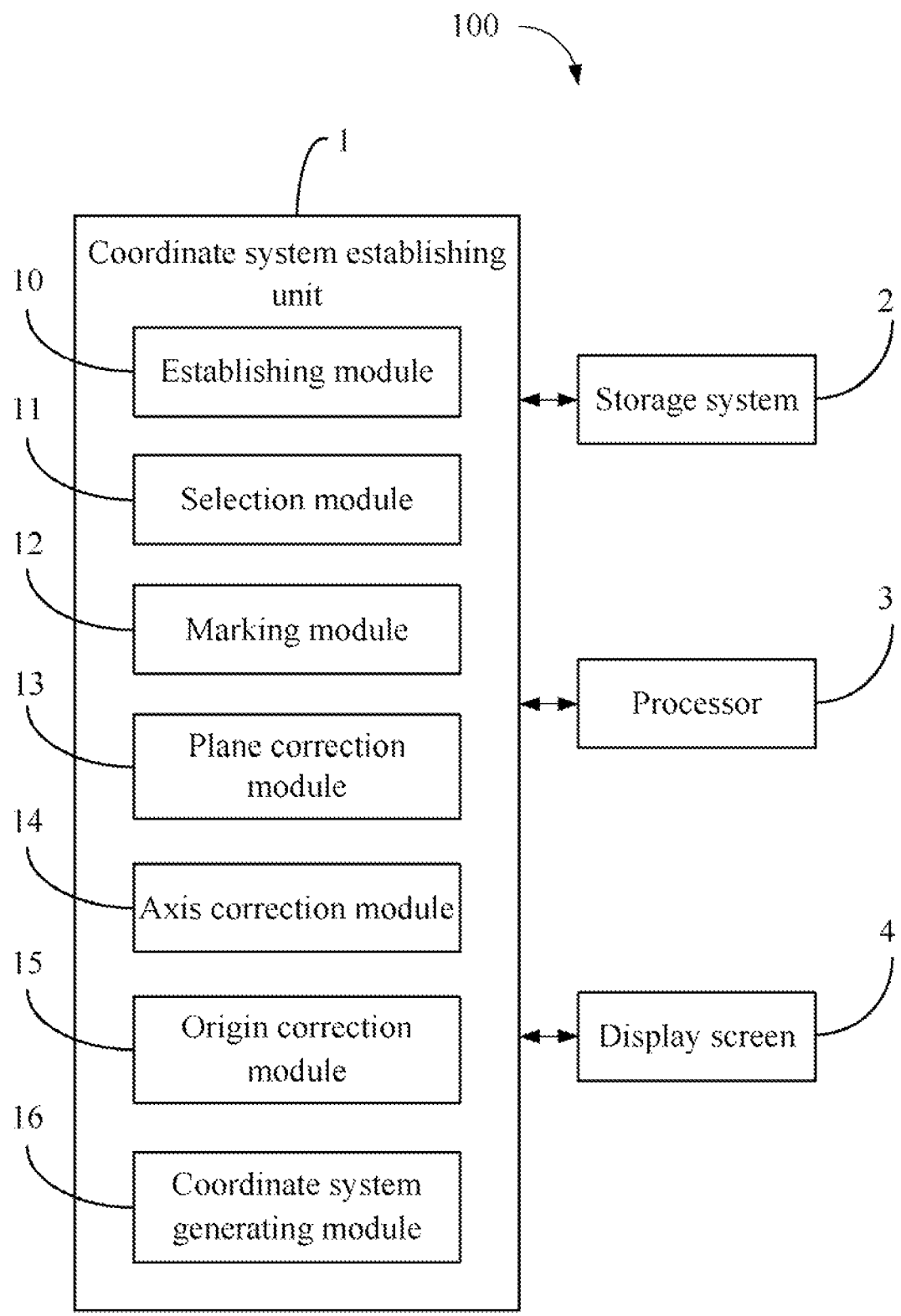
FIG. 1 is a block diagram of one embodiment of a computing device including a coordinate system establishing unit.

FIG. 1 is a block diagram of one embodiment of a computing device 100 including a coordinate system establishing unit 1. The computing device 100 further includes, but is not limited to, a storage system 2, at least one processor 3, and a display device 4. In one embodiment, the computing device 100 may be a computer, a server, a portable electronic device, or any other data processing device. Functions of the coordinate system establishing unit 1 are implemented by the computing device 100. The coordinate system establishing unit 1 may be a software program in form of computerized instructions stored in the storage system 2 and executed by the at least one processor 3.

In one embodiment, the storage system 2 may be a magnetic or an optical storage system, such as a hard disk drive, an optical disk drive, a compact disc, a digital video disc, a tape drive, or other suitable storage medium. The processor 3 may be a central processing unit including a math co-processor, for example.

The display screen 4 displays a design drawing 300 (FIG. 3) of a product, provides a parameter setting interface, and displays coordinate systems and an axial selector 200. In one embodiment, the parameter setting interface receives a selection of a feature element from the design drawing 300 by clicking a graphic corresponding to the feature element and selecting an item containing a name of the feature element from a menu. In one embodiment, the feature element may be a point, a line, a curve, a plane, a circle, a sphere, a column, a cone, or a triangle.

In one embodiment, the coordinate system establishing unit 1 includes an establishing module 10, a selection module 11, a marking module 12, a plane correction module 13, an axis correction module 14, an origin correction module 15, and a coordinate system generating module 16. Each of the modules 10-16 may be a software program including one or more computerized instructions that are stored in the storage system 2 and executed by the processor 3. Detailed functions of the modules 10-16 are described in FIG. 2 to FIG. 5 below.

Figure 2:
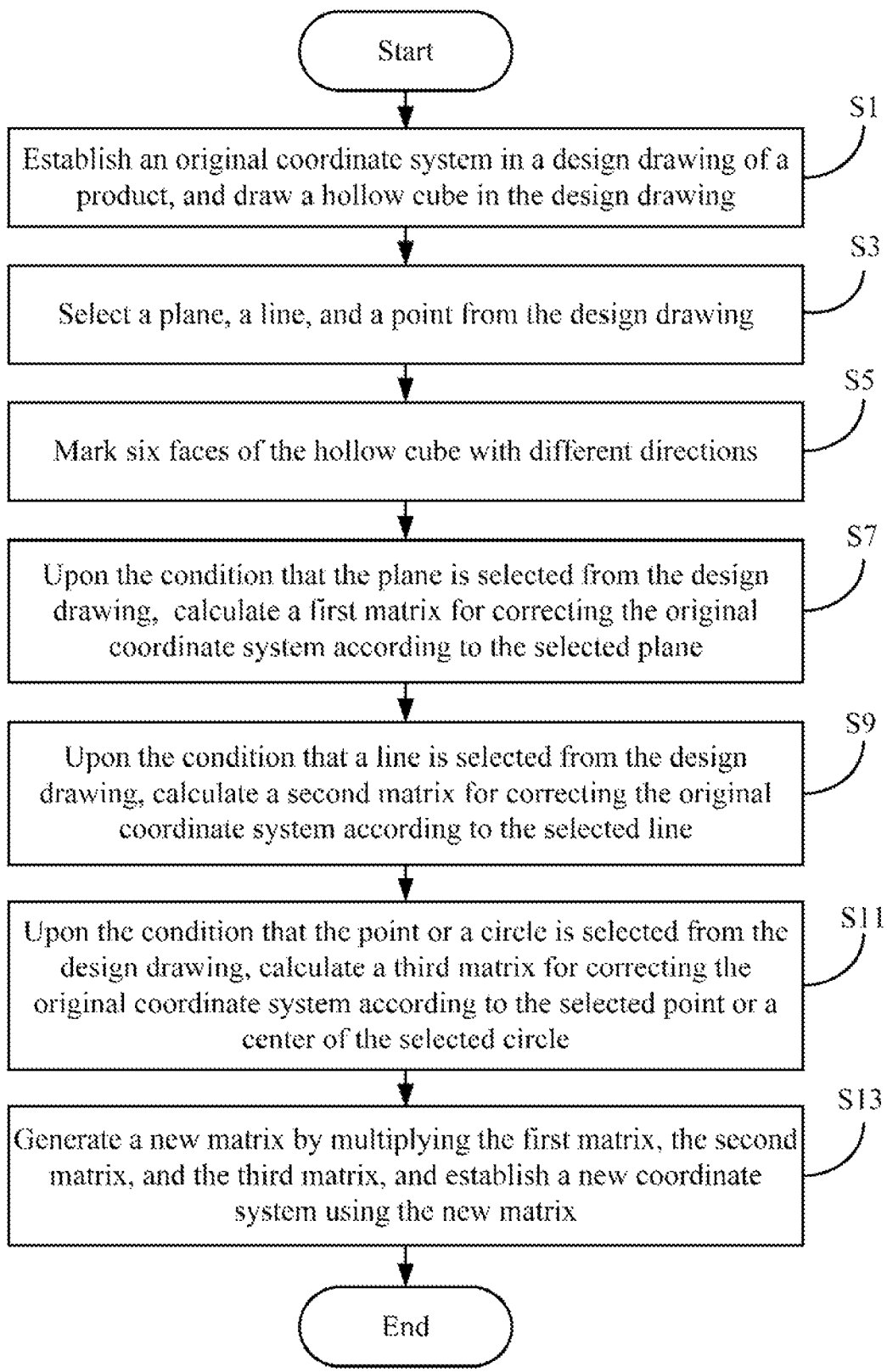
FIG. 2 is a flowchart illustrating one embodiment of a method for establishing a three-dimensional coordinate system using the computing device of FIG. 1.

FIG. 2 is a flowchart illustrating one embodiment of a method for establishing a three-dimensional (3D) coordinate system using the computing device of FIG. 1. Depending on the embodiment, additional steps may be added, others removed, and the ordering of the steps may be changed.

Figure 3:
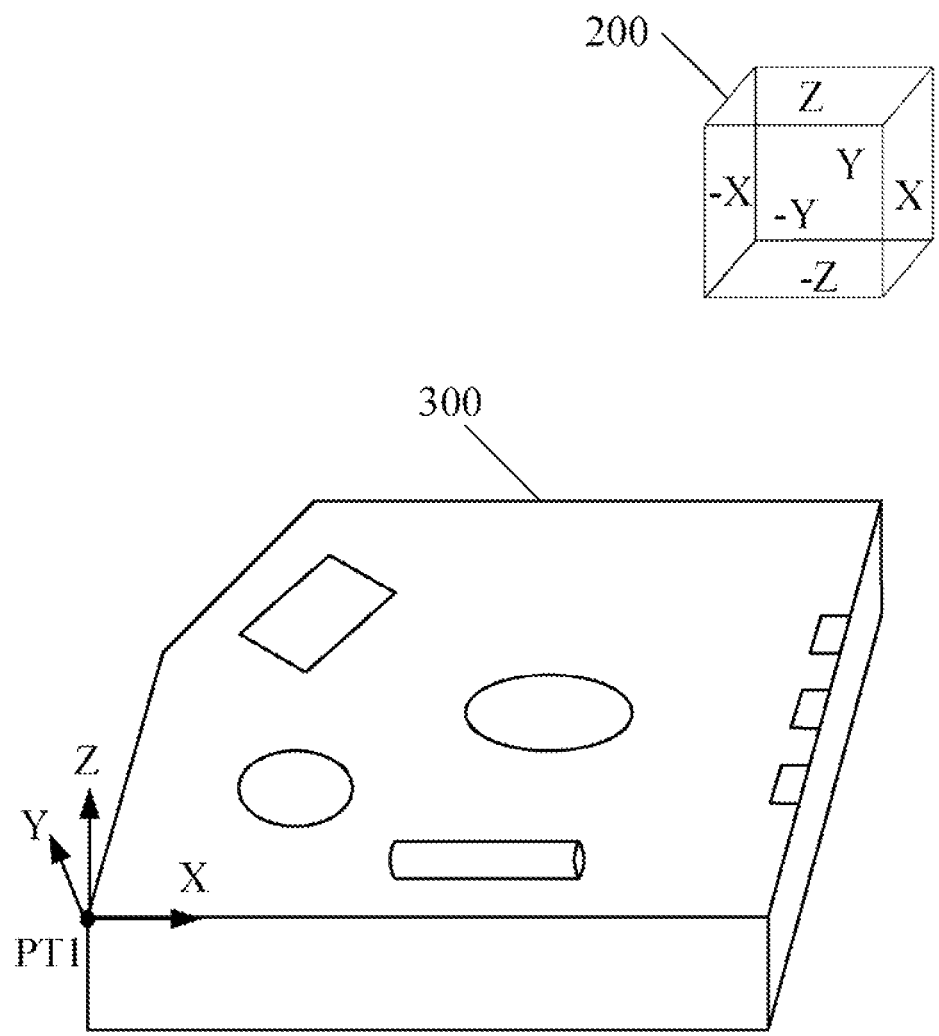
FIG. 3 is a schematic diagram illustrating aspects of one example of establishing an original coordinate system and drawing a axial selector.

In step 1, the establishing module 10 imports a design drawing 300 of the product from the storage system 2, establishes an original coordinate system in the design drawing 300, draws a hollow cube, and sets the hollow cube as an axial selector 200 (as shown in FIG. 3). In the embodiment, a size of the axial selector 200 is not limited, and an attribute file corresponding to the axial selector 200 is saved in the storage system 2. From the storage system, coordinate values of each point on the axial selector 200 can be obtained. In FIG. 3, the original coordinate system is a 3D coordinate system, and a point "PTI" is an origin of the original coordinate system. The axial selector 200 includes six faces.

In step S3, the selection module 11 receives a selection of feature elements from the design drawing 300. The feature elements may include a plane, a line, or a point.

In step S5, the marking module 12 marks the six faces of the axial selector 200 with different directions, and each of the six faces corresponds to one marked direction (as shown in FIG. 3). The marked directions may be a positive x-axis, a positive y-axis, a positive z-axis, a negative x-axis, a negative y-axis, or a negative z-axis.

Upon the condition that the plane is selected from the design drawing 300, in step S7, the plane correction module 13 calculates a first matrix according to the selected plane. The first matrix is used for executing a plane correction on the original coordinate system, to generate a new coordinate system.

In detail, the plane correction module 13 establishes the selected plane as a reference plane, selects one face from the axial selector 200, and determines an front side of the reference plane according to the marked direction of the selected face. The plane correction module 13 then calculates the first matrix according to a normal direction of the front side of the reference plane and the original coordinate system (detailed in FIG. 5).

In the embodiment, the reference plane is established by enlarging the selected plane. The method of determining the selected plane is described in FIG. 4 in detail. An example of how to determine the front side of the reference plane is to take the marked direction of the selected face as the positive z-axis, and take a normal direction of the selected face as pointing upwards. If the axis of the original coordinate system whose normal direction is to point upwards is taken as the positive z-axis, the plane correction module 13 determines that the normal direction of the selected plane is the same as the positive z-axis of the original coordinate system. According to the determination, the plane correction module 13 determines that the front side of the reference plane points upwards. If the marked direction of the selected face is the negative z-axis, and the normal direction of the selected plane is the same as the negative z-axis of the original coordinate system, then the plane correction module 13 determines that the front side of the reference plane is pointing downwards.

Upon the condition that a line is selected from the design drawing 300, in step S9, the axis correction module 14 calculates a second matrix according to the selected line. The second matrix is used for correcting the axis of the original coordinate system, to determine a direction of each axis of the new coordinate system.

In detail, the axis correction module 14 selects a face from the axial selector 200, and determines an axis of the original coordinate system to be corrected (such as an x-axis of the original coordinate system) according to a preset rotation angle and the marked direction of the selected face. By considering a starting point of the selected line as a rotation point, and by considering a normal direction of a plane that is constructed by a normal direction of the selected line and the marked direction of the selected face as a rotation axis, the axis correction module 14 obtains a first coordinate system by rotating the original coordinate system to the same angle as the preset rotation angle. The axis correction module 14 calculates the second matrix to correct the axis (i.e., the x-axis of the original coordinate system) according to the first coordinate system. A formula of calculating the second matrix is the same as the formula of calculating the first matrix, which will be detailed in FIG. 5.

In the embodiment, the preset rotation angle is obtained by user input into the parameter setting interface displayed on the display screen 4. In one embodiment, the preset rotation angle can be zero or not zero. The axis correction module 14 defaults to a preset rotation angle of zero, upon the condition that the user has not set a different value for the preset rotation angle in the parameter setting interface.

In the embodiment, the axis correction module 14 determines that an axis corresponding to the marked direction of the selected face is the axis of the original coordinate system to be corrected, upon the condition that the rotation angle is equal to zero. For example, if the face marked with the positive x-axis is selected from the axial selector 200, the axis correction module 14 determines that the x-axis of the original coordinate system is to be corrected by using the selected line.

In another embodiment, the axis correction module 14 obtains a rotated line by rotating the axis corresponding to the marked direction of the face with the rotation angle, and determines that the rotated line is the axis of the original coordinate system to be corrected, upon the condition that the rotation angle is not equal to zero.

In order to correct the axis of the original coordinate system, more than one feature element may be selected from the design drawing 300, for example, two lines, a circle, or a plane may be selected. In detail, if a single line is selected from the design drawing 300, the single line is determined as the selected line. If more than one feature element is selected from the design drawing 300, the axis correction module 14 fits the first two feature elements of the more than one feature elements into the selected line. If two lines are selected from the design drawing, the axis correction module 14 obtains the selected line by connecting the midpoints of the two lines. If two circles are selected from the design drawing, the axis correction module 14 obtains the selected line by connecting the centers of the two circles.

Upon the condition that the point is selected from the design drawing 300, in step S11, the origin correction module 15 calculates a third matrix according to the selected point. The third matrix may be described in terms of:

$$\begin{bmatrix} 1 & 0 & 0 & X \\ 0 & 1 & 0 & Y \\ 0 & 0 & 1 & Z \\ 0 & 0 & 0 & 1 \end{bmatrix},$$

and is used for correcting the origin of the original coordinate system. In detail, the origin correction module 15 corrects the origin of the original coordinate system by multiplying the third matrix with a coordinate value of the origin of the original coordinate system, and obtains the origin of the new coordinate system. In step S11, if a circle is selected from the design drawing 300, the origin correction module 15 calculates the third matrix according to a center of the selected circle.

For example, if a point is selected from the design drawing 300, the faces marked with the positive x-axis, the positive y-axis, and the positive z-axis, or marked with one or more negative axes which are selectable from the axial selector 200, the origin correction module 15 determines that the coordinate value of the origin of the new coordinate system is equal to the coordinate value of the origin of the original coordinate system. If a circle is selected from the design drawing 300, the origin correction module 15 determines that a center of the selected circle is the origin of the new coordinate system.

In another embodiment, once a line is selected from the design drawing 300 in step S3, an invitation to the user to choose either an axial correction or an origin correction may be displayed. If the user selects the axial correction, step S9 is implemented. If the user selects the origin correction, in step S11, the origin correction module 15 determines that a midpoint of the selected line is the new coordinate system.

In step S13, the coordinate system generating module 16 generates a new matrix by multiplying the first matrix, the second matrix, and the third matrix, and establishes the new coordinate system for the design drawing 300 using the new matrix. The new coordinate system may be displayed on the display screen 4.

In the embodiment, if the origin of the new coordinate system is incorrect, and does not meet a requirement of the user, the user can drag the axial selector 200 as required, and correct a position of the origin of the new coordinate system.

Figure 4:
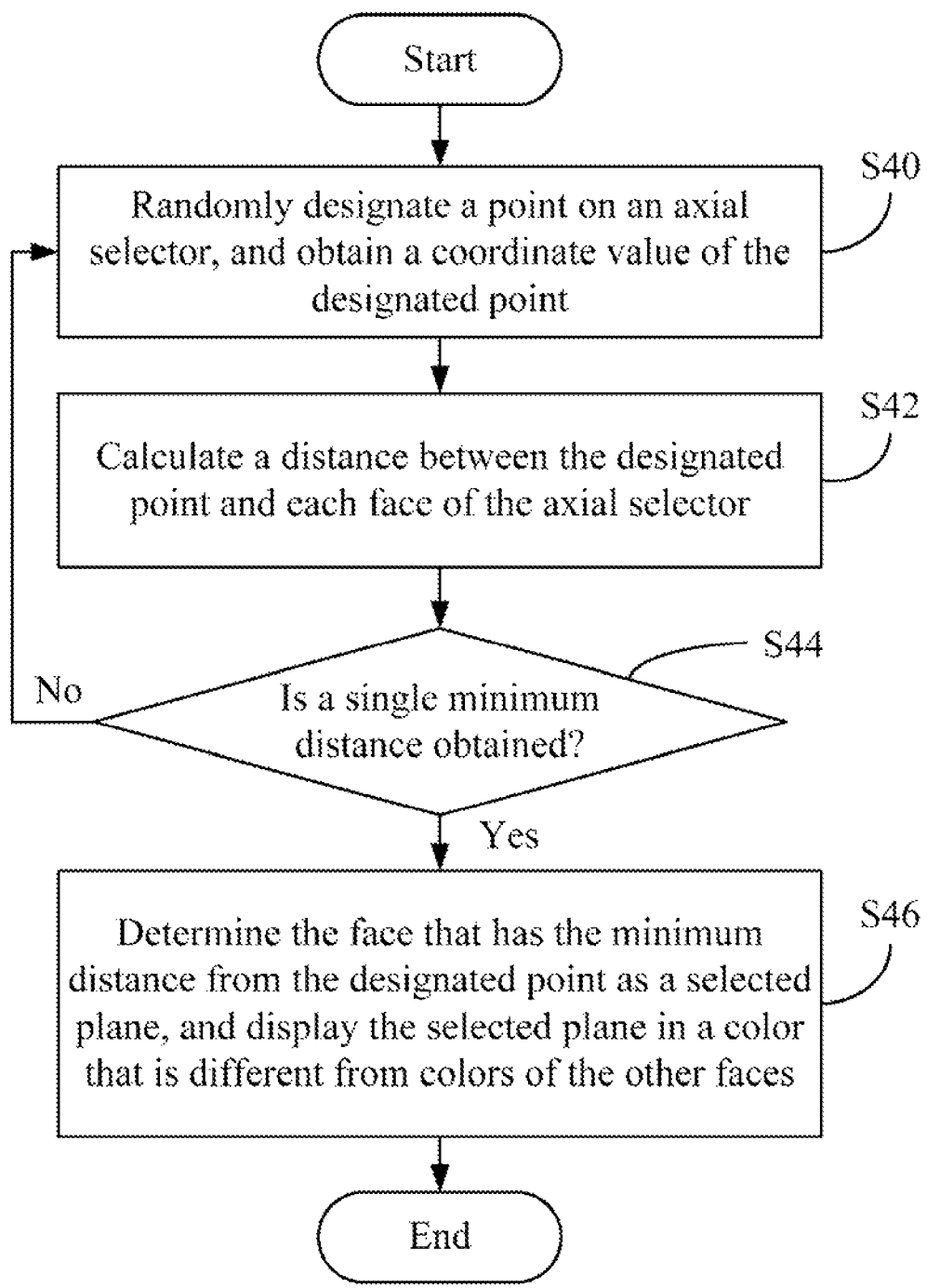
FIG. 4 is a detailed flowchart of one step of FIG. 2, namely, determining a selected face from six faces of an axial selector.

FIG. 4 is a detailed flowchart of step 7 of FIG. 2, namely, determining the selected face from the six faces of the axial selector 200 during the calculation of the first matrix.

Depending on the embodiment, additional steps may be added, others removed, and the ordering of the steps may be changed.

In step S40, the plane correction module 13 randomly designates a point on the axial selector 200, and obtains a coordinate value of the designated point by reading an attribute file of the axial selector 200 from the storage system 2.

In step S42, the plane correction module 13 calculates a distance between the designated point and each face of the axial selector 200, and finds a minimum distance.

In step S44, the plane correction module 13 determines whether a single minimum distance is obtained. If more than one minimum distance is obtained, the flow returns to step S40. Otherwise, if a single minimum distance is obtained, the flow goes to step S46.

In step S46, the plane correction module 13 determines the face that has the minimum distance from the designated point as the selected plane, and displays the selected plane in a color that is different from any color(s) of the other faces of the axial selector 200, upon the condition that only one face of the axial selector 200 has the minimum distance from the designated point.

Figure 5:
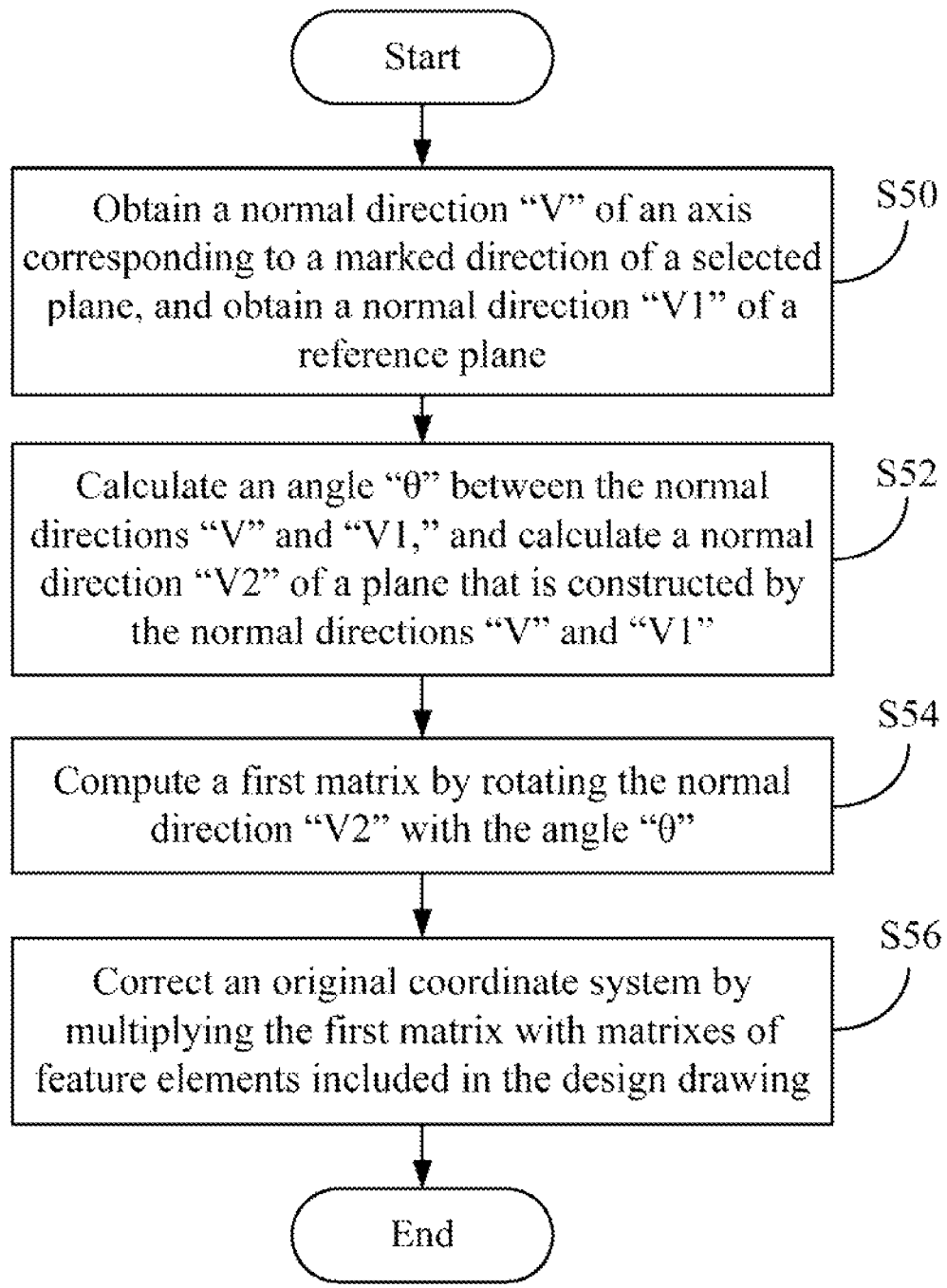
FIG. 5 is a detailed flowchart of one step of FIG. 2, namely, calculating a first matrix to correct the original coordinate system according to a normal direction of a front side of a reference plane and an original coordinate system.

FIG. 5 is a detailed flowchart of step S7 of FIG. 2, namely calculating the first matrix according to the selected plane.

In step S50, the plane correction module 13 obtains a normal direction "V" of an axis corresponding to the marked direction of the selected plane, and obtains a normal direction "V1" of the reference plane.

In step S52, the plane correction module 13 calculates an angle θ between the normal directions "V" and "V1," and calculates a normal direction "V2" of a plane that is constructed by the normal directions "V" and "V1."

In step S54, the plane correction module 13 computes the first matrix by rotating the normal direction "V2" by angle "θ." The angle "θ" is computed by the following formula:

$$A1 = \cos\left[\frac{V \cdot x * V1 \cdot x + V \cdot y * V1 \cdot y + V \cdot z * V1 \cdot z}{\sqrt{(V \cdot x^2 + V \cdot y^2 + V \cdot z^2) * (V1 \cdot x^2 + V1 \cdot y^2 + V1 \cdot z^2)}}\right], \text{ where}$$

$$V2 \cdot x = V \cdot y * V1 \cdot z - V1 \cdot y * V \cdot z,$$
$$V2 \cdot y = V \cdot z * V1 \cdot x - V1 \cdot z * V \cdot x, \text{ and}$$
$$V2 \cdot z = V \cdot x * V1 \cdot y - V1 \cdot x * V \cdot y.$$

In step S56, the plane correction module 13 corrects the original coordinate system by multiplying the first matrix with matrixes of feature elements included in the design drawing 300.

Although certain embodiments have been specifically described above, the present disclosure is not to be construed as being limited thereto. Various changes or modifications may be made to the present embodiments without departing from the scope and spirit of the present disclosure.

What is claimed is:

1. A computer-implemented method for establishing a three-dimensional coordinate system using a computing device, the method comprising steps of:
    establishing an original coordinate system in a design drawing of a product, and drawing a hollow cube in the design drawing, the hollow cube comprising six faces;
    selecting a plane, a line, and a point from the design drawing;
    marking the six faces of the hollow cube with directions, the marked directions comprising a positive x-axis, a positive y-axis, a positive z-axis, a negative x-axis, a negative y-axis, and a negative z-axis, each of the six faces corresponding to one of the marked directions;
    calculating a first matrix for correcting the original coordinate system according to the selected plane, comprising: establishing a reference plane according to the selected plane, selecting one face from the hollow cube and determining a front side of the reference plane according to the marked direction of the selected face, and calculating the first matrix according to a normal direction of the front side of the reference plane, the reference plane being generated by enlarging the selected plane, and the one face being selected from the hollow cube; by randomly designating a point on the design drawing, calculating a distance between the designated point and each of the six faces of the hollow cube, determining the face that has a minimum distance from the designated point as the selected plane, and displaying the selected plane in a color that is different from colors of the other faces when one face of the hollow cube has the minimum distance from the designated point; or returning to randomly designating another point on the design drawing, when more than one faces have the minimum distance from the designated point;
    calculating a second matrix for correcting the original coordinate system according to the selected line;
    calculating a third matrix for correcting the original coordinate system according to the selected point;
    generating a new matrix by multiplying the first matrix, the second matrix, and the third matrix, and establishing a new coordinate system for the design drawing of the product using the new matrix; and
    displaying the new coordinate system on a display screen of the computing device.

2. The method as described in claim 1, wherein the original coordinate system is corrected using the first matrix by steps of:
    obtaining a first normal direction of an axis corresponding to the marked direction of the selected plane, and obtaining a second normal direction of the reference plane;
    calculating an angle between the first and second normal directions, and calculating a third normal direction of a plane that is constructed by the first and second normal directions;
    computing the first matrix by rotating the third normal direction with the angle; and
    correcting the original coordinate system by multiplying the first matrix with matrixes of feature elements comprised in the design drawing of the product, the feature elements comprising a point, a line, a curve, a plane, a circle, a sphere, a column, a circular cone, and a triangle.

3. The method as described in claim 1, wherein the selected line is selected by:
    selecting a single line from the design drawing as the selected line; or
    selecting more than one feature elements of the design drawing, and fitting the first two feature elements of the more than one feature elements into the selected line; or
    selecting two lines from the design drawing, and obtaining the selected line by connecting midpoints of the two lines; or
    selecting two circles from the design drawing, and obtaining the selected line by connecting centers of the two circles.

4. The method as described in claim 3, wherein correcting the original coordinate system using the second matrix comprises:

selecting a face from the hollow cube, and determining that an axis of the original coordinate system is to be corrected according to a preset rotation angle and the marked direction of the selected face;

considering a starting point of the selected line as a rotation point, considering a normal direction of a plane that is constructed by a normal direction of the selected line and the marked direction of the selected face as a rotation axis, and obtaining a first coordinate system by rotating the original coordinate system with the preset rotation angle according to the rotation point and the rotation axis; and calculating the second matrix to correct the axis of the original coordinate system according to the first coordinate system.

5. The method as described in claim 4, wherein the step of correcting the original coordinate system using the second matrix further comprises:

determining that an axis corresponding to the marked direction of the face selected from the hollow cube is the axis of the original coordinate system to be corrected, upon the condition that the rotation angle is equal to zero; or obtaining a rotated line by rotating the axis corresponding to the marked direction of the face selected from the hollow cube with the rotation angle, and determining that the rotated line is the axis of the original coordinates system to be corrected, upon the condition that the rotation angle is not equal to zero.

6. The method as described in claim 1, wherein the step of calculating a third matrix for correcting the original coordinate system comprises:

upon the condition that a point is selected from the design drawing and one or more faces are selected from the hollow cube, determining an origin of the new coordinate system according to the one ore more faces and calculating the third matrix of the origin to correct the original coordinate system; or upon the condition that a point is selected from the design drawing, and the faces with the positive x-axis, the positive y-axis, and the positive z-axis are selected, or the faces with one or more negative axes are selected, determining that the origin of the original coordinate system is an origin of the new coordinate system; or upon the condition that a circle is selected from the design drawing, determining that a center of the selected circle is the origin of the new coordinate system.

7. The method as described in claim 1, further comprising:
dragging the hollow cube to move, and correcting a position of an origin of the new coordinate system, upon the condition that the origin of the new coordinate system is not correct.

8. A computing device, comprising:
at least one processor;
a storage system;
a display device; and
one or more modules that are stored in the storage system and executed by the at least one processor, the one or more modules comprising:
an establishing module that establishes an original coordinate system in a design drawing of a product, and draws a hollow cube in the design drawing, the hollow cube comprising six faces;

a selection module that selects a plane, a line, and a point from the design drawing;

a marking module that marks the six faces of the hollow cube with different directions, the marked directions comprising a positive x-axis, a positive y-axis, a positive z-axis, a negative x-axis, a negative y-axis, and a negative z-axis, each of the six faces corresponding to one of the marked directions;

a plane correction module that calculates a first matrix for correcting the original coordinate system according to the selected plane, comprising establishing a reference plane according to the selected plane, selecting one face from the hollow cube and determining a front side of the reference plane according to the marked direction of the selected face, and calculating the first matrix according to a normal direction of the front side of the reference plane, the reference plane being generated by enlarging the selected plane, and the one face being selected from the hollow cube; by randomly designating a point on the design drawing, calculating a distance between the designated point and each of the six faces of the hollow cube, determining the face that has a minimum distance from the designated point as the selected plane, and displaying the selected plane in a color that is different from colors of the other faces when one face of the hollow cube has the minimum distance from the designated point; or returning to randomly designating another point on the design drawing, when more than one faces have the minimum distance from the designated point;

an axis correction module that calculates a second matrix for correcting the original coordinate system according to the selected line;

an origin correction module that calculates a third matrix for correcting the original coordinate system according to the selected point; and a coordinate system generating module that generates a new matrix by multiplying the first matrix, the second matrix, and the third matrix, establishes a new coordinate system for the design drawing of the product using the new matrix, and displays the new coordinate system on the display screen.

9. The computing device as described in claim 8, wherein the plane correction module corrects the original coordinate system using the first matrix by steps of:

obtaining a first normal direction of an axis corresponding to the marked direction of the selected plane, and obtaining a second normal direction of the reference plane;

calculating an angle between the first and second normal directions, and calculating a third normal direction of a plane that is constructed by the first and second normal directions;

computing the first matrix by rotating the third normal direction with the angle; and correcting the original coordinate system by multiplying the first matrix with matrixes of feature elements comprised in the design drawing of the product, the feature elements comprising a point, a line, a curve, a plane, a circle, a sphere, a column, a circular cone, and a triangle.

10. The computing device as described in claim 8, wherein the selection module selects a line by one step of:

selecting a single line from the design drawing as the selected line;

selecting more than one feature elements of the design drawing, and fitting the first two feature elements of the more than one feature elements into the selected line;

selecting two lines from the design drawing, and obtaining the selected line by connecting midpoints of the two lines; and selecting two circles from the design drawing, and obtaining the selected line by connecting centers of the two circles.

11. The computing device as described in claim 10, wherein the axis correction module correcting the original coordinate system using the second matrix comprises:

selecting a face from the hollow cube, and determining that an axis of the original coordinate system is to be corrected according to a preset rotation angle and the marked direction of the selected face;

considering a starting point of the selected line as a rotation point, considering a normal direction of a plane that is constructed by a normal direction of the selected line and the marked direction of the selected face as a rotation axis, and obtaining a first coordinate system by rotating the original coordinate system with the preset rotation angle according to the rotation point and the rotation axis; and calculating the second matrix to correct the axis of the original coordinate system according to the first coordinate system.

12. The computing device as described in claim 8, wherein the origin correction module calculating a third matrix for correcting the original coordinate system comprises:

upon the condition that a point is selected from the design drawing and one or more faces are selected from the hollow cube, determining an origin of the new coordinate system according to the one or more faces and calculating the third matrix of the origin to correct the original coordinate system; or upon the condition that a point is selected from the design drawing, and the faces with the positive x-axis, the positive y-axis, and the positive z-axis are selected, or the faces with one or more negative axes are selected, determining that the origin of the original coordinate system is an origin of the new coordinate system; or upon the condition that a circle is selected from the design drawing, determining that a center of the selected circle is the origin of the new coordinate system.

13. A non-transitory computer readable storage medium having stored thereon instructions that, when executed by a processor of a computing device, cause the computing device to perform a method for establishing a three-dimensional coordinate system, the method comprising steps of:

establishing an original coordinate system in a design drawing of a product, and drawing a hollow cube in the design drawing, the hollow cube comprising six faces;

selecting a plane, a line, and a point from the design drawing;

marking the six faces of the hollow cube with directions, the marked directions comprising a positive x-axis, a positive y-axis, a positive z-axis, a negative x-axis, a negative y-axis, and a negative z-axis, each of the six faces corresponding to one of the marked directions;

calculating a first matrix for correcting the original coordinate system according to the selected plane, comprising establishing a reference plane according to the selected plane, selecting one face from the hollow cube and determining a front side of the reference plane according to the marked direction of the selected face, and calculating the first matrix according to a normal direction of the front side of the reference plane, the reference plane being generated by enlarging the selected plane, and the one face being selected from the hollow cube; by randomly designating a point on the design drawing, calculating a distance between the designated point and each of the six faces of the hollow cube, determining the face that has a minimum distance from the designated point as the selected plane, and displaying the selected plane in a color that is different from colors of the other faces when one face of the hollow cube has the minimum distance from the designated point; or returning to randomly designating another point on the design drawing, when more than one faces have the minimum distance from the designated point;

calculating a second matrix for correcting the original coordinate system according to the selected line;

calculating a third matrix for correcting the original coordinate system according to the selected point;

generating a new matrix by multiplying the first matrix, the second matrix, and the third matrix, and establishing a new coordinate system for the design drawing of the product using the new matrix; and displaying the new coordinate system on a display screen of the computing device.

14. The storage medium as described in claim 13, wherein the original coordinate system is corrected using the first matrix by steps of:

obtaining a first normal direction of an axis corresponding to the marked direction of the selected plane, and obtaining a second normal direction of the reference plane;

calculating an angle between the first and second normal directions, and calculating a third normal direction of a plane that is constructed by the first and second normal directions;

computing the first matrix by rotating the third normal direction with the angle; and correcting the original coordinate system by multiplying the first matrix with matrixes of feature elements comprised in the design drawing of the product, the feature elements comprising a point, a line, a curve, a plane, a circle, a sphere, a column, a circular cone, and a triangle.

15. The storage medium as described in claim 13, wherein the selected line is selected by one step of:

selecting a single line from the design drawing as the selected line; or selecting more than one feature elements of the design drawing, and fitting the first two feature elements of the more than one feature elements into the selected line;

selecting two lines from the design drawing, and obtaining the selected line by connecting midpoints of the two lines; and selecting two circles from the design drawing, and obtaining the selected line by connecting centers of the two circles.

16. The storage medium as described in claim 13, wherein correcting the original coordinate system using the second matrix comprising:

selecting a face from the hollow cube, and determining that an axis of the original coordinate system is to be corrected according to a preset rotation angle and the marked direction of the selected face;

considering a starting point of the selected line as a rotation point, considering a normal direction of a plane that is constructed by a normal direction of the selected line and the marked direction of the selected face as a rotation axis, and obtaining a first coordinate system by rotating the original coordinate system with the preset rotation angle according to the rotation point and the rotation axis; and calculating the second matrix to correct the axis of the original coordinate system according to the first coordinate system.

* * * * *